(12) United States Patent
Wang et al.

(10) Patent No.: US 12,550,443 B2
(45) Date of Patent: Feb. 10, 2026

(54) DISPLAY SUBSTRATE, MANUFACTURING METHOD THEREFOR, AND DISPLAY DEVICE

(71) Applicant: BOE Technology Group Co., Ltd., Beijing (CN)

(72) Inventors: Dongfang Wang, Beijing (CN); Wei Liu, Beijing (CN); Hehe Hu, Beijing (CN); Lizhong Wang, Beijing (CN); Ce Ning, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 393 days.

(21) Appl. No.: 18/028,569

(22) PCT Filed: Jun. 30, 2022

(86) PCT No.: PCT/CN2022/103082
§ 371 (c)(1),
(2) Date: Mar. 27, 2023

(87) PCT Pub. No.: WO2024/000494
PCT Pub. Date: Jan. 4, 2024

(65) Prior Publication Data
US 2024/0363641 A1   Oct. 31, 2024

(51) Int. Cl.
*H10D 86/60* (2025.01)
*H10D 86/01* (2025.01)
*H10D 86/40* (2025.01)

(52) U.S. Cl.
CPC ........... *H10D 86/60* (2025.01); *H10D 86/021* (2025.01); *H10D 86/441* (2025.01); *H10D 86/451* (2025.01)

(58) Field of Classification Search
None
See application file for complete search history.

(56) References Cited

U.S. PATENT DOCUMENTS

| 2011/0049523 A1* | 3/2011 | Choi ............... H10D 86/471 438/34 |
| 2011/0079784 A1* | 4/2011 | Im ................. H10K 59/1213 438/157 |

(Continued)

FOREIGN PATENT DOCUMENTS

| CN | 109300917 A | 2/2019 |
| CN | 111430382 A | 7/2020 |

(Continued)

OTHER PUBLICATIONS

Gwanghyeon Baek et al., "P-11: Electrical Properties and Stability of Dual-Gate Coplanar Homojunction Amorphous Indium-Gallium-Zinc-Oxide Thin-Film Transistor", SID Symposium Digest of Technical Papers, pp. 1136-1139, Jun. 2011.

*Primary Examiner* — Bo B Jang
(74) *Attorney, Agent, or Firm* — Ling Wu; Stephen Yang; Ling and Yang Intellectual Property

(57) ABSTRACT

A display substrate, a manufacturing method therefor, and a display device are provided. The display substrate includes a base substrate and at least one transistor disposed on the base substrate, with a transistor including an active layer pattern disposed on the base substrate; a first source-drain electrode disposed on the base substrate and electrically connected with the active layer pattern; a first gate electrode disposed on a side of the active layer pattern away from the base substrate, the first gate electrode and the active layer pattern having overlapped orthographic projections on the base substrate and are not in contact with each other; a second source-drain electrode disposed on a side of the active lay pattern away from the base substrate and including a first sub-electrode and a second sub-electrode connected with each other, the second sub-electrode is located on a side of the first sub-electrode close to the first gate electrode, the first sub-electrode is electrically connected (Continued)

with the active layer pattern, the second sub-electrode and the active layer pattern have overlapped orthographic projections on the base substrate and are not in contact with each other.

18 Claims, 8 Drawing Sheets

(56) References Cited

U.S. PATENT DOCUMENTS

| | | |
|---|---|---|
| 2015/0123084 A1 | 5/2015 | Kim et al. |
| 2020/0105789 A1 | 4/2020 | Fang et al. |
| 2020/0185527 A1 | 6/2020 | Miyamoto |
| 2021/0173244 A1 | 6/2021 | Jeong et al. |
| 2021/0181554 A1 | 6/2021 | Hong et al. |
| 2022/0157907 A1 | 5/2022 | Wang et al. |
| 2023/0099934 A1 | 3/2023 | Gong et al. |

FOREIGN PATENT DOCUMENTS

| | | |
|---|---|---|
| CN | 112397562 A | 2/2021 |
| CN | 112992920 A | 6/2021 |
| CN | 113053912 A | 6/2021 |
| CN | 111725324 B | 11/2021 |
| CN | 113745246 A | 12/2021 |
| JP | 2020150086 A | 9/2020 |

* cited by examiner

DISPLAY SUBSTRATE, MANUFACTURING METHOD THEREFOR, AND DISPLAY DEVICE

CROSS-REFERENCE TO RELATED APPLICATION

The present application is a U.S. National Phase Entry of International Application PCT/CN2022/103082 having an international filing date of Jun. 30, 2022, and entitled "Display Substrate, Manufacturing Method Therefor, and Display Device". The entire contents of the above-identified application are hereby incorporated by reference.

TECHNICAL FIELD

The present disclosure relates, but is not limited, to the field of display technology, and in particular to a display substrate, a manufacturing method therefor, and a display device.

BACKGROUND

In recent years, low temperature polysilicon thin film transistor (LTPS TFT for short) and oxide thin film transistor have attracted much attention in the display industry, and each has its own advantages and are evenly matched. Low temperature polysilicon thin film transistors have advantages of high mobility and fast charging. InGaZnOxide (IGZO) thin film transistor (i.e., IGZO-TFT) has become a research hotspot because of its high carrier mobility, high thermal properties and high chemical stability in its active layer (IGZO). Manufacturing of IGZO thin film transistors with high performance and high stability has become the focus and difficulty researched by various manufacturers.

With the increase of pixel density and refresh rate of products, parasitic capacitance in the extension direction of data lines becomes the most important factor that restricts the increase of pixel density and refresh rate of a display panel. At the same time, sizes and currents of transistors in a pixel circuit are key factors affecting capacitance and power consumption of a driving circuit.

SUMMARY

The following is a summary of subject matter described herein in detail. The summary is not intended to limit the protection scope of claims.

In one aspect, the present disclosure provides a display substrate including a base substrate and at least one transistor disposed on the base substrate; the at least one transistor includes:

an active layer pattern disposed on the base substrate;
a first source-drain electrode disposed on the base substrate, with the first source-drain electrode being electrically connected with the active layer pattern;
a first gate electrode disposed on a side of the active layer pattern away from the base substrate, wherein orthographic projections of the first gate electrode and the active layer pattern on the base substrate are overlapped with each other and the first gate electrode and the active layer pattern are not in contact with each other; and
a second source-drain electrode disposed on a side of the active lay pattern away from the base substrate, the second source-drain electrode includes a first sub-electrode and a second sub-electrode connected with each other, the second sub-electrode is located on a side of the first sub-electrode close to the first gate electrode, the first sub-electrode is electrically connected with the active layer pattern, orthographic projections of the second sub-electrode and the active layer pattern on the base substrate are overlapped with each other and the second sub-electrode and the active layer pattern are not in contact with each other.

In an exemplary embodiment, the second source-drain electrode further includes a third sub-electrode located on a side of the first sub-electrode away from the first gate electrode, and orthographic projections of the third sub-electrode and the active layer pattern on the base substrate are overlapped with each other and the third sub-electrode and the active layer pattern are not in contact with each other.

In an exemplary embodiment, the first sub-electrode and the second sub-electrode are integrally formed.

In an exemplary embodiment, the first source-drain electrode includes a fourth sub-electrode and a fifth sub-electrode connected with each other, the fifth sub-electrode is located on a side of the fourth sub-electrode away from the first gate electrode, the fourth sub-electrode is electrically connected with the active layer pattern, and orthographic projections of the fifth sub-electrode and the active layer pattern on the base substrate are overlapped with each other and the fifth sub-electrode and the active layer pattern are not in contact with each other.

In an exemplary embodiment, the transistor further includes a first insulating layer, the first insulating layer is positioned between the active layer pattern and the first gate electrode, the first insulating layer covers the active layer pattern, the first source-drain electrode, the first gate electrode and the second source-drain electrode are all located on a side of the first insulating layer away from the base substrate, a first via and a second via are provided in the first insulating layer, the first source-drain electrode is electrically connected with the active layer pattern through the first via, and the second source-drain electrode is electrically connected with the active layer pattern through the second via.

In an exemplary embodiment, the transistor further includes a first insulating layer, the first insulating layer includes at least one insulating layer pattern, the at least one insulating layer pattern covers a part of the active layer pattern, and there is a non-overlapping region between an orthographic projection of the at least one insulating layer pattern and an orthographic projection of at least part of the active layer pattern on the base substrate, the first source-drain electrode, the first gate electrode and the second source-drain electrode are all located on a side of the first insulating layer away from the base substrate, and the first source-drain electrode and the second source-drain electrode are electrically connected with the non-overlapping region of the active layer pattern respectively.

In an exemplary embodiment, the display substrate further includes a pixel electrode disposed on a side of the transistor away from the base substrate, and the pixel electrode and the second source-drain electrode are integrally formed.

In an exemplary embodiment, the first source-drain electrode and the active layer pattern are integrally formed.

In an exemplary embodiment, the display substrate further includes a signal line electrically connected with the first source-drain electrode.

In an exemplary embodiment, the signal line is located between the first source-drain electrode and the base substrate, and the display substrate further includes a buffer layer, the buffer layer is located between the signal line and the active layer pattern, a third via is provided in the buffer layer, and the first source-drain electrode is electrically connected with the signal line through the third via.

In an exemplary embodiment, the first source-drain electrode and the active layer pattern are integrally formed, the signal line is electrically contacted with the first source-drain electrode, and the signal line is located on a side of the first source-drain electrode close to the base substrate, or the signal line is located on a side of the first source-drain electrode away from the base substrate.

In an exemplary embodiment, a material of the active layer pattern is an oxide semiconductor.

In an exemplary embodiment, the transistor is configured as a transistor in a gate driving circuit.

In another aspect, the present disclosure further provides a display device, including the aforementioned display substrate.

In another aspect, the present disclosure further provides a method for manufacturing a display substrate, including:

forming an active layer pattern on a substrate;

forming a first source-drain electrode on the base substrate so that at least a part of the first source-drain electrode is electrically connected with the active layer pattern;

forming a first gate electrode on a side of the active layer pattern away from the base substrate, so that orthographic projections of the first gate electrode and the active layer pattern on the base substrate are overlapped with each other and the first gate electrode and the active layer pattern are not in contact with each other; and forming a second source-drain electrode on a side of the active layer pattern away from the base substrate, the second source-drain electrode includes a first sub-electrode and a second sub-electrode connected with each other, the second sub-electrode is located on a side of the first sub-electrode close to the first gate electrode, the first sub-electrode is electrically connected with the active layer pattern, and orthographic projections of the second sub-electrode and the active layer pattern on the base substrate are overlapped with each other and the second sub-electrode and the active layer pattern are not in contact with each other.

Other aspects will become apparent upon reading and understanding of the accompanying drawings and the detailed description.

BRIEF DESCRIPTION OF DRAWINGS

Accompanying drawings are used for providing an understanding for technical solutions of the present application and form a part of the specification, are used for explaining the technical solutions of the present application together with embodiments of the present application, and do not constitute a limitation on the technical solutions of the present application.

DETAILED DESCRIPTION

Figure 1A:
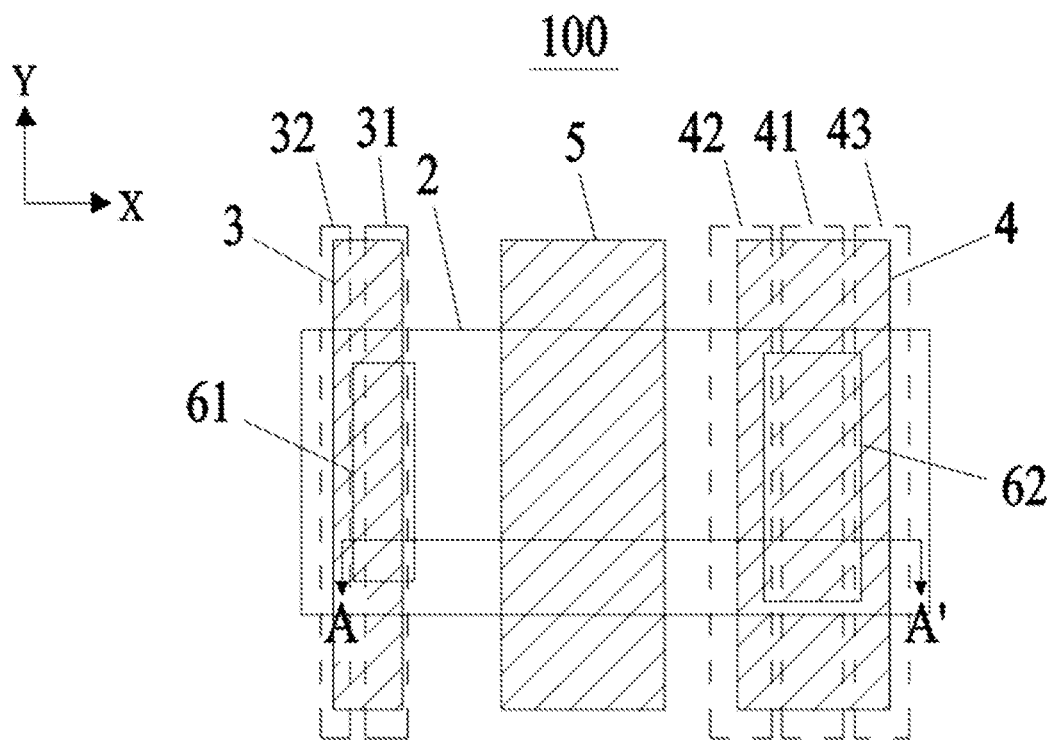
FIG. 1a is a first schematic diagram of a structure of a transistor in a display substrate according to an embodiment of the present disclosure.

To make objectives, technical solutions, and advantages of the present disclosure clearer, an embodiment of the present disclosure will be described in detail with reference to the accompanying drawings. It is to be noted that implementation modes may be implemented in multiple different forms. Those of ordinary skills in the art may easily understand such a fact that implementation modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of each constituent element, a thickness of a layer, or a region is exaggerated sometimes for clarity. Therefore, one implementation mode of the present disclosure is not necessarily limited to the sizes, and shapes and sizes of various components in the drawings do not reflect actual scales. In addition, the drawings schematically illustrate ideal examples, and one implementation mode of the present disclosure is not limited to the shapes, numerical values, or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, a detachable connection or an integral connection. It may be a mechanical connection or an electrical connection. It may be a direct mutual connection, or an indirect connection through middleware, or an internal communication between two components. Those of ordinary skills in the art may understand specific meanings of these terms in the present disclosure according to specific situations.

In this specification, a transistor refers to an element including at least three terminals: a first gate electrode, a second source-drain electrode, and a first source-drain electrode. The transistor has a channel region between the second source-drain electrode (second source-drain terminal, drain region or second source-drain) and the first source-drain electrode (first source-drain terminal, source region or first source-drain), and current can flow through the second source-drain electrode, the channel region and the first source-drain electrode. It is to be noted that, in the specification, the channel region refers to a region through which the current mainly flows.

In this specification, a first electrode may be a second source-drain electrode, a second electrode may be a first source-drain electrode, or the first electrode may be a first source-drain electrode and the second electrode may be a second source-drain electrode. Functions of "a first source-drain electrode" and "a second source-drain electrode" are sometimes interchangeable in a case of the use of transistors with opposite polarities or the change of current direction during operation of the circuit. Therefore, in this specification, "a first source-drain electrode" and "a second source-drain electrode" are interchangeable.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

Figure 5:
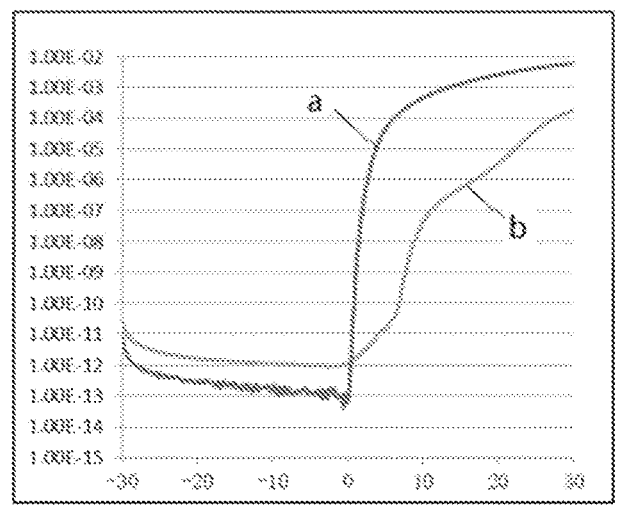
FIG. 5 is curve graph showing a drain-source current when a transistor in a display substrate is under voltage in the related art.

FIG. 5 is curve graph showing a drain-source current when a transistor in a display substrate in the related art is under a voltage. Through the research of the inventor of the present disclosure, it is found that transistors are prone to transistor negative drift or (data line-gate line short) DGS under voltage, which leads to failure of a driving circuit. In FIG. 5, the horizontal axis is a voltage Vg of the first gate electrode (in volts), and the vertical axis is a drain-source current (in amps). As shown in FIG. 5, a curve of the drain-source current before transistor failure is a, and a curve of the drain-source current after transistor failure is b. The failure of transistor is caused by device attenuation because of high voltage and high current density.

An embodiment of the present disclosure provides a display substrate including a base substrate and at least one transistor disposed on the base substrate; the at least one transistor includes:

an active layer pattern disposed on the base substrate;
a first source-drain electrode disposed on the base substrate, the first source-drain electrode is electrically connected with the active layer pattern;
a first gate electrode disposed on a side of the active layer pattern away from the base substrate, orthographic projections of the first gate electrode and the active layer pattern on the base substrate are overlapped with each other and the first gate electrode and the active layer pattern are not in contact with each other;
a second source-drain electrode disposed on the side of the active lay pattern away from the base substrate, the second source-drain electrode includes a first sub-electrode and a second sub-electrode connected with each other, the second sub-electrode is located on a side of the first sub-electrode close to the first gate electrode, the first sub-electrode is electrically connected with the active layer pattern, orthographic projections of the second sub-electrode and the active layer pattern on the base substrate are overlapped with each other and the second sub-electrode and the active layer pattern are not in contact with each other.

In the display substrate according to the embodiment of the present disclosure, the orthographic projections of the second sub-electrode of the second source-drain electrode and the active layer pattern on the base substrate are overlapped with each other and the second sub-electrode of the second source-drain electrode and the active layer pattern are not in contact with each other, with the first sub-electrode of the second source-drain electrode in electrical connection with the active layer pattern. On the one hand, when a transistor is discharged, the first sub-electrode in the second source-drain electrode can be configured as a source-drain electrode, and the second sub-electrode in the second source-drain electrode can be configured as a second gate electrode, so that a dual-gate structure is formed in the transistor, the leakage current $I_{off}$ is effectively reduced and an impact of high current density on the transistor is avoided. On the other hand, when the transistor is charged, both the first sub-electrode and the second sub-electrode of the second source-drain electrode can be configured as source-drain electrodes, so that a single-gate structure is formed in the transistor, and which increases the charging speed.

Figure 1B:
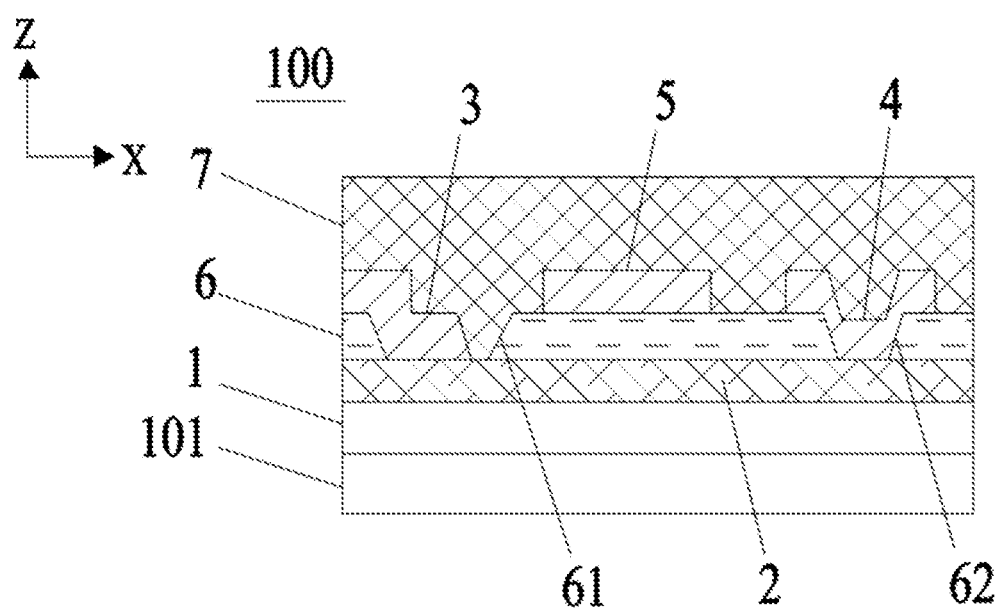
FIG. 1b is a first cross-sectional view of a display substrate according to an embodiment of the present disclosure.

FIG. 1a is a first schematic diagram of a structure of a transistor in a display substrate according to an embodiment of the present disclosure. FIG. 1b is a first cross-sectional view of a display substrate according to an embodiment of the present disclosure. Herein, FIG. 1b is a cross-sectional view along A-A' in FIG. 1a. In an exemplary embodiment, as shown in FIGS. 1a and 1b, in a direction perpendicular to the display substrate, the display substrate according to the embodiment of the present disclosure may include a base substrate 101 and at least one transistor 100 disposed on the base substrate 101. The at least one transistor 100 includes a buffer layer 1, a semiconductor layer, a first insulating layer 6, a conductive layer, and a second insulating layer 7 disposed on the base substrate 101. The semiconductor layer includes an active layer pattern 2. The conductive layer includes a first source-drain electrode 3, a second source-drain electrode 4 and a first gate electrode 5. In a direction parallel to the display substrate, the first source-drain electrode 3, the second source-drain electrode 4, and the first gate electrode 5 all extend in a second direction (e.g. direction Y), the first source-drain electrode 3, the second source-drain electrode 4, and the first gate electrode 5 are arranged at intervals along a first direction (e.g. direction X), and the first gate electrode 5 is located between the first source-drain electrode 3 and the second source-drain electrode 4. Herein, the first direction is different from the second direction, and, for example, the first direction is perpendicular to the second direction.

In an exemplary embodiment, each transistor 100 may be an oxide thin film transistor, and the active layer in the transistor is an oxide semiconductor material, for example, the active layer in the transistor may be indium gallium zinc oxide (IGZO).

In an exemplary embodiment, the transistor 100 may be used as a transistor in circuits such as a gate drive circuit, an input circuit, and an operating voltage circuit.

In an exemplary embodiment, as shown in FIG. 1b, the orthographic projections of the first gate electrode 5 and the active layer pattern 2 on the base substrate 101 are overlapped with each other, and the first gate electrode 5 and the active layer pattern 2 are separated from each other by the first insulating layer 6 and are not in contact with each other.

In an exemplary embodiment, as shown in FIGS. 1a and 1b, a first via 61 and a second via 62 are provided in the first insulating layer 6. The first source-drain electrode 3 is electrically connected with the active layer pattern 2 through the first via 61, and the second source-drain electrode 4 includes a first sub-electrode 41 and a second sub-electrode 42 connected with each other. The second sub-electrode 42 is located on a side of the first sub-electrode 41 close to the first gate electrode 5. Orthographic projections of the second sub-electrode 42 and the active layer pattern 2 on the base substrate 101 are overlapped with each other, and the second sub-electrode 42 and the active layer pattern 2 are separated from each other by the first insulating layer 6 and are not in contact with each other. The first sub-electrode 41 is electrically connected with the active layer pattern 2 through the second via 62. Herein, the first insulating layer 6 may also be referred to as a gate insulating (GI) layer.

In an exemplary embodiment, the first sub-electrode 41 and the second sub-electrode 42 may be integrally formed to form a layer of film structure, and the first sub-electrode 41 and the second sub-electrode 42 may be manufactured using a same material by a same manufacturing process.

In an exemplary embodiment, as shown in FIGS. 1a and 1b, the second source-drain electrode 4 further includes a third sub-electrode 43, and the third sub-electrode 43 is located on a side of the first sub-electrode 41 away from the first gate electrode 5, and orthographic projection of the third sub-electrode 43 and the active layer pattern 2 on the base substrate 101 are overlapped with each other, and are separated from each other by the first insulating layer 6 without contact with each other.

In an exemplary embodiment, as shown in FIGS. 1a and 1b, the first source-drain electrode 3 includes a fourth sub-electrode 31 and a fifth sub-electrode 32 connected with each other. The fifth sub-electrode 32 is located on a side of the fourth sub-electrode 31 away from the first gate electrode 5, the fourth sub-electrode 31 is electrically connected with the active layer pattern 2. Orthographic projections of the fifth sub-electrode 32 and the active layer pattern 2 on the base substrate 101 are overlapped with each other and the fifth sub-electrode 32 and the active layer pattern 2 are separated from each other by the first insulating layer 6 and not in contact with each other. Herein, the fourth sub-electrode 31 and the fifth sub-electrode 32 may be integrally formed to form a layer of film structure, and the fourth sub-electrode 31 and the fifth sub-electrode 32 may be manufactured using a same material by a same manufacturing process.

Figure 2:
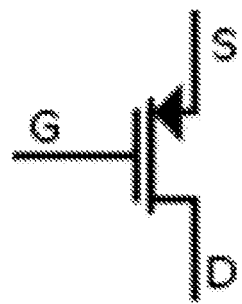
FIG. 2 is a circuit symbol of a transistor in a display substrate according to an embodiment of the present disclosure.

FIG. 2 is a circuit symbol of a transistor in a display substrate according to an embodiment of the present disclosure. In an exemplary embodiment, as shown in FIG. 2, G is a gate, S is a source, and D is a drain. When a value of a gate-source voltage Vgs (i.e. Vg−Vs) is greater than a threshold voltage Vth, the transistor is cut off, and at this point, there is a leakage current $I_{off}$ between the drain and the source. When the gate-source voltage Vgs is lower than the threshold voltage Vth, the transistor works, the source voltage is higher than the drain voltage, and holes flow from the source to the drain as carriers through the channel region.

Figure 3A:
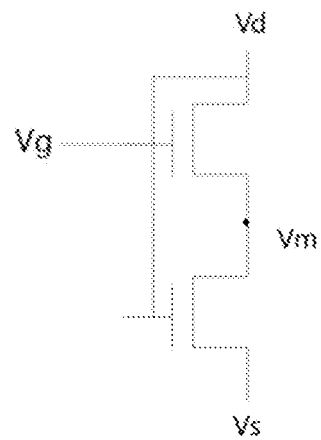
FIG. 3a is a first equivalent circuit diagram of a transistor in a display substrate according to an embodiment of the present disclosure.
Figure 3B:
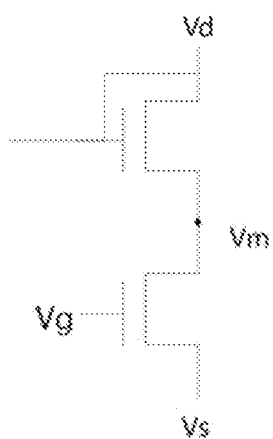
FIG. 3b is a second equivalent circuit diagram of a transistor in a display substrate according to an embodiment of the present disclosure.

FIG. 3a is a first equivalent circuit diagram of a transistor in a display substrate according to an embodiment of the present disclosure. FIG. 3b is a second equivalent circuit diagram of a transistor in a display substrate according to an embodiment of the present disclosure. In an exemplary embodiment, as shown in FIGS. 3a and 3b, when the transistor in the display substrate according to the embodiment of the present disclosure is discharged, a high potential voltage Vg may be applied to the first gate electrode 5 of the transistor, a high potential voltage Vd may be applied to the second source-drain electrode 4 of the transistor, and a low potential voltage Vs may be applied to the first source-drain electrode 3 of the transistor, so that the first sub-electrode 41 in the second source-drain electrode 4 is configured as a source-drain electrode, and the second sub-electrode 42 in the second source-drain electrode 4 is configured as a second gate electrode, thereby a dual-gate structure is formed in the transistor. When the transistor in the display substrate according to the embodiment of the present disclosure is charged, a high potential voltage Vg may be applied to the first gate electrode 5 of the transistor, a low potential voltage Vd may be applied to the second source-drain electrode 4 of the transistor, and a high potential voltage Vs may be applied to the first source-drain electrode 3 of the transistor, so that both the first sub-electrode 41 and the second sub-electrode 42 of the second source-drain electrode 4 are configured as source-drain electrodes, thereby a single-gate structure is formed in the transistor.

In an exemplary embodiment, the drain-source current $I_{ds}$ of the transistor in the display substrate according to the embodiment of the present disclosure during discharging is calculated by the following formula:

$$I_{ds} = \mu \times CoxW_1/L_1 \times \left[(0 - Vth_1) \times Vm - 1/2 \times Vm^2\right] =$$
$$\mu \times CoxW_2/L_2 \times \left[(Vgs - Vm) \times (Vd - Vm) - 1/2 \times (Vd - Vm)^2\right]$$

In an exemplary embodiment, the drain-source current $I_{ds}$ of the transistor in the display substrate according to the embodiment of the present disclosure during charging is calculated by the following formula:

$$I_{ds} =$$
$$\mu \times CoxW_1/L_1 \times \left[(Vd - Vm - Vth_1) \times (Vd - Vm) - 1/2(Vd - Vm)^2\right] =$$
$$\mu \times Cox \times W_2/L_2 \times \left[(Vgs - Vth_2) \times Vm - 1/2 \times Vm^2\right]$$

Among them, Vm is a related variable, which is related to a specific design of the transistor, through the above formula, it can be calculated concretely that $W_1$ is a length of the first gate electrode 5 in a first direction (e.g. direction X); $L_1$ is a length of the first gate electrode 5 in a second direction (e.g. direction Y); $Vth_1$ is a threshold voltage of the first gate electrode 5; $W_2$ is a length of the second gate electrode in the first direction (e.g. direction X); $L_2$ is a length of the second gate electrode in the second direction (e.g. direction Y); $Vth_2$ is a threshold voltage of the second gate electrode.

Figure 4A:
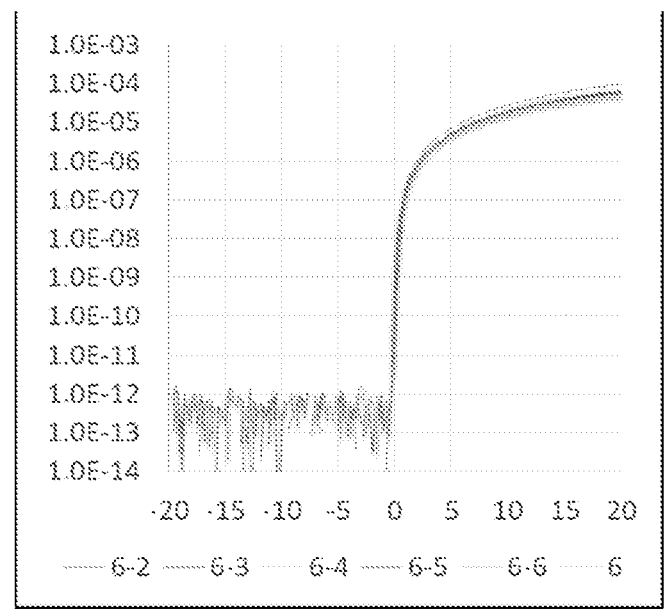
FIG. 4a is a first curve graph showing a drain-source current of a transistor in a display substrate during charging according to an embodiment of the present disclosure.
Figure 4B:
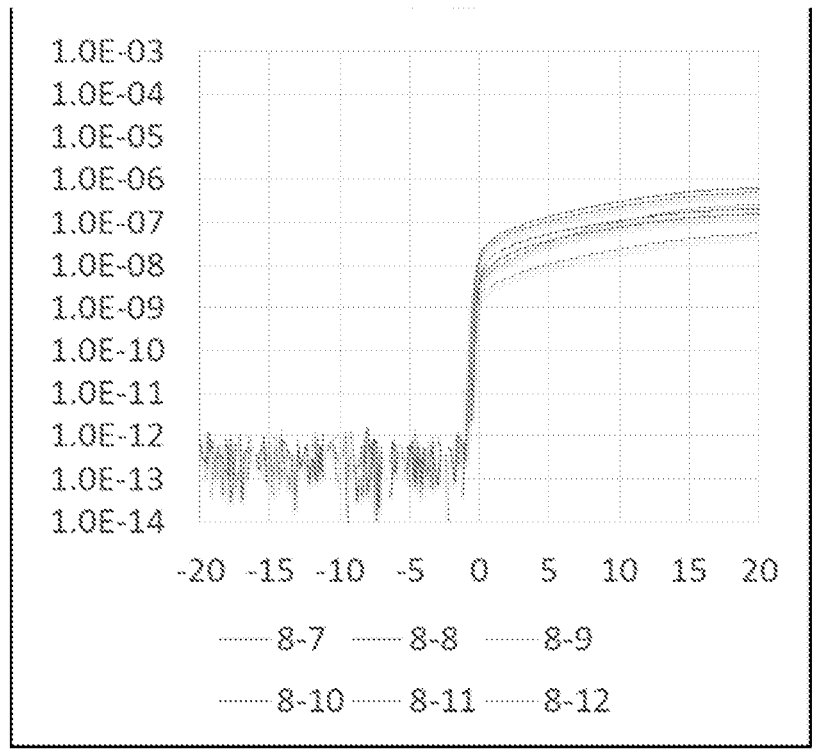
FIG. 4b is a first curve graph showing a drain-source current of a transistor in a display substrate during discharging according to an embodiment of the present disclosure.

FIG. 4a is a first curve graph showing a drain-source current of a transistor in a display substrate during charging according to an embodiment of the present disclosure. FIG. 4b is a first curve graph showing a drain-source current of a transistor in a display substrate during discharging according to an embodiment of the present disclosure. Herein, FIG. 4a and FIG. 4b are curve graphs of drain-source currents using the equivalent circuit shown in FIG. 3a. In FIGS. 4a and 4b, the horizontal axis is the voltage Vg of the first gate electrode (in volts), and the vertical axis is the drain-source current $I_{ds}$ (in amps). As shown in FIG. 4a, when the transistor in the display substrate according to the embodiment of the present disclosure is charged, a single-gate structure is formed in the transistor, and an on-state current $I_{on}$ varies greatly. As shown in FIG. 4b, when the transistor in the display substrate according to the embodiment of the present disclosure is discharged, a dual-gate structure is formed in the transistor, which can effectively control the on-state current Ion and avoid the impact of high current density on the transistor. The display substrate according to the embodiment of the present disclosure can accelerate the charging speed during charging and effectively reduce the leakage current $I_{off}$ during discharge. In the display substrate according to the embodiment of the present disclosure, if a turn-on voltage is adjusted to be above 0.5V, the transistor can be turned off reversely.

Figure 4C:
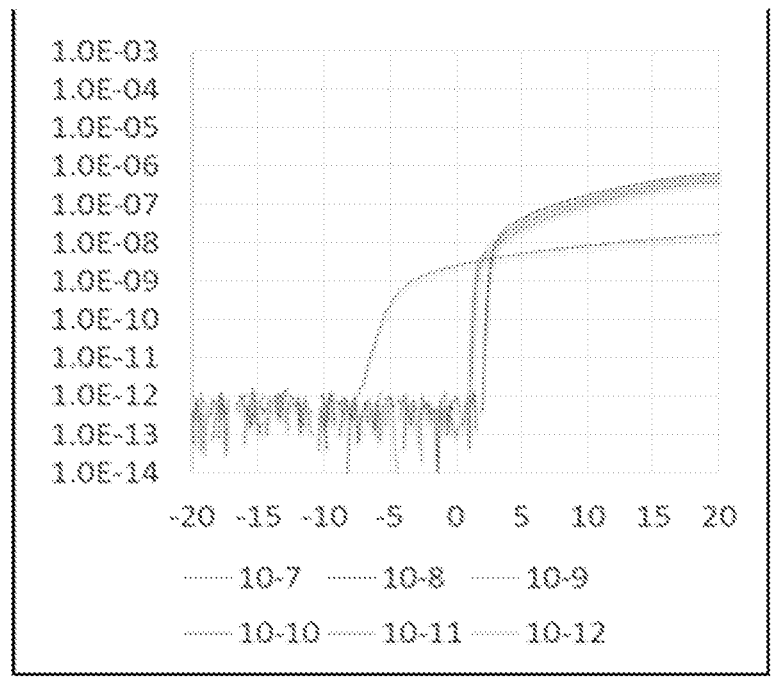
FIG. 4c is a second curve graph showing a drain-source current of a transistor in a display substrate during charging according to an embodiment of the present disclosure.
Figure 4D:
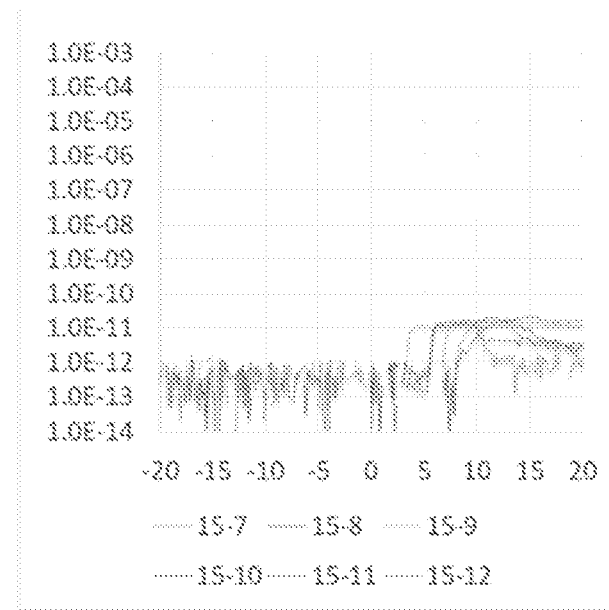
FIG. 4d is second curve graph showing a drain-source current of a transistor in a display substrate during discharging according to an embodiment of the present disclosure.

FIG. 4c is a second curve graph showing a drain-source current of a transistor in a display substrate during charging according to an embodiment of the present disclosure. FIG. 4d is a second graph showing a drain-source current of a transistor in a display substrate during discharging according to an embodiment of the present disclosure. Herein, FIG. 4c and FIG. 4d are curve graphs of drain-source currents using the equivalent circuit shown in FIG. 3b. In FIGS. 4c and 4d, the horizontal axis is the voltage Vg of the first gate electrode (in volts), and the vertical axis is the drain-source current $I_{ds}$ (in amps). As shown in FIG. 4c, during charging of the transistor in the display substrate according to the embodiment of the present disclosure, a single-gate structure is formed in the transistor, and an on-state current $I_{on}$ varies greatly. As shown in FIG. 4d, during discharging of the transistor in the display substrate according to the embodiment of the present disclosure, a dual-gate structure is formed in the transistor, which can effectively control the on-state current $I_{on}$ and avoid the impact of high current density on the transistor. The display substrate according to the embodiment of the present disclosure can accelerate the charging speed during charging and effectively reduce the leakage current $I_{off}$ during discharging.

Figure 6:
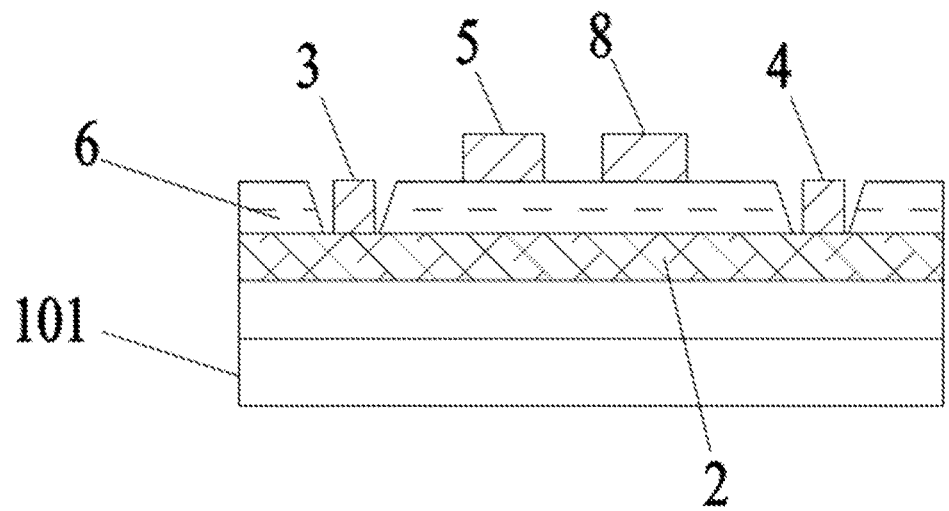
FIG. 6 is a cross-sectional view of a transistor in a display substrate in the related art.

FIG. 6 is a cross-sectional view of a transistor in a display substrate in the related art. As shown in FIG. 6, the transistor in the related display substrate may have a double-gate structure, and the transistor includes an active layer pattern 2 and a first source-drain electrode 3, a first gate electrode 5, a second gate electrode 8, and a second source-drain electrode 4 disposed on the base substrate 101 sequentially. The first gate electrode 5 and the second gate electrode 8 are disconnected from each other and insulated, the orthographic projections of both the first gate electrode 5 and the second gate electrode 8 on the base substrate 101 overlap with an orthographic projection of the active layer pattern 2 on the base substrate 101, and both the first source-drain electrode 3 and the second source-drain electrode 4 are electrically connected with the active layer pattern 2.

The second sub-electrode in the display substrate according to the embodiment of the present disclosure is used as a second gate electrode, so that the second sub-electrode is located on a side of the first sub-electrode close to the gate, compared with the double-gate structure of the transistor in the display substrate in the related art, in the display substrate according to the embodiment of the present disclosure, a distance between the second gate electrode and the second source-drain electrode is eliminated, and a conductorized resistance of the active layer pattern is adjusted by controlling a distance between the second sub-electrode and the first gate electrode, thus implementing adjustment of the threshold voltage Vth.

Figure 7A:
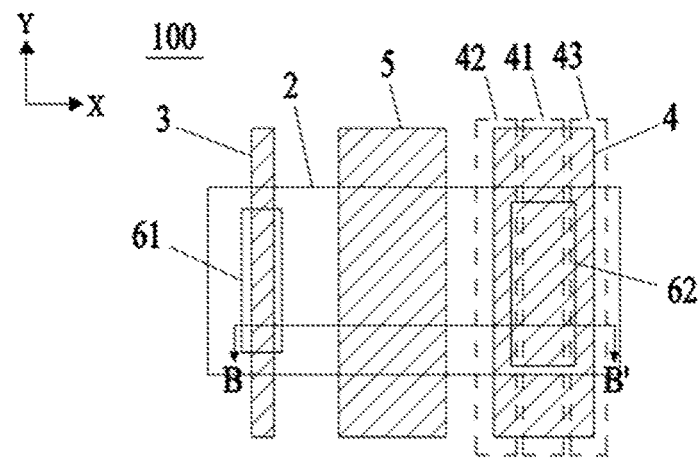
FIG. 7a is a second schematic diagram of a structure of a transistor in a display substrate according to an embodiment of the present disclosure.
Figure 7B:
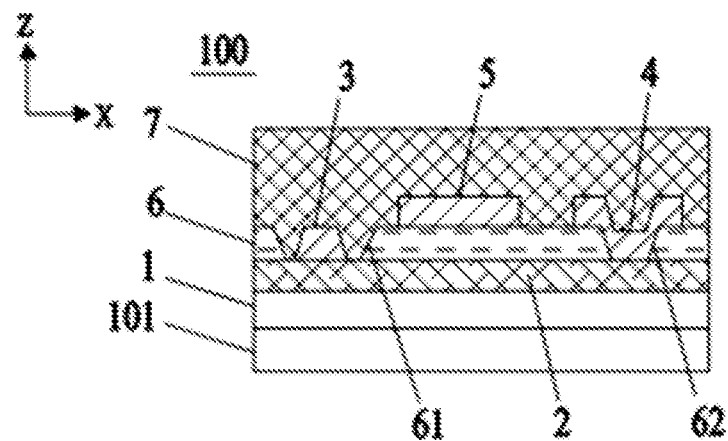
FIG. 7b is a second cross-sectional view of a display substrate according to an embodiment of the present disclosure.

FIG. 7a is a second schematic diagram of a structure of a transistor in a display substrate according to an embodiment of the present disclosure. FIG. 7b is a second cross-sectional view of a display substrate according to an embodiment of the present disclosure. Herein, FIG. 7b is a cross-sectional view along B-B' in FIG. 7a. In an exemplary embodiment, as shown in FIGS. 7a and 7b, in a direction perpendicular to the display substrate, the transistor 100 in the display substrate according to the embodiment of the present disclosure includes a buffer layer 1, a semiconductor layer, a first insulating layer 6, a conductive layer, and a second insulating layer 7 disposed on a base substrate 101. The semiconductor layer includes an active layer pattern 2. The conductive layer includes a first source-drain electrode 3, a second source-drain electrode 4 and a first gate electrode 5. Orthographic projections of the first gate electrode 5 and the active layer pattern 2 on the base substrate 101 are overlapped with each other, and the first gate electrode 5 and the active layer pattern 2 are separated from each other by the first insulating layer 6 and are not in contact with each other. A first via 61 and a second via 62 is provided in the first insulating layer 6, the first source-drain electrode 3 is electrically connected with the active layer pattern 2 through the first via 61, and the second source-drain electrode 4 includes a first sub-electrode 41, a second sub-electrode 42, and a third sub-electrode 43 connected with each other. The first sub-electrode 41 is electrically connected with the active layer pattern 2 through the second via 62. The second sub-electrode 42 is located on a side of the first sub-electrode 41 close to the first gate electrode 5. The third sub-electrode 43 is located on the side of the first sub-electrode 41 away from the first gate electrode 5. Orthographic projections of both the second sub-electrode 42 and the third sub-electrode 43 are overlapped with the orthographic projection of the active layer pattern 2 on the base substrate 101, and both the second and third sub-electrodes 42 and 43 are separated from the active layer pattern 2 by the first insulating layer 6 and are not in contact with each other.

Figure 8A:
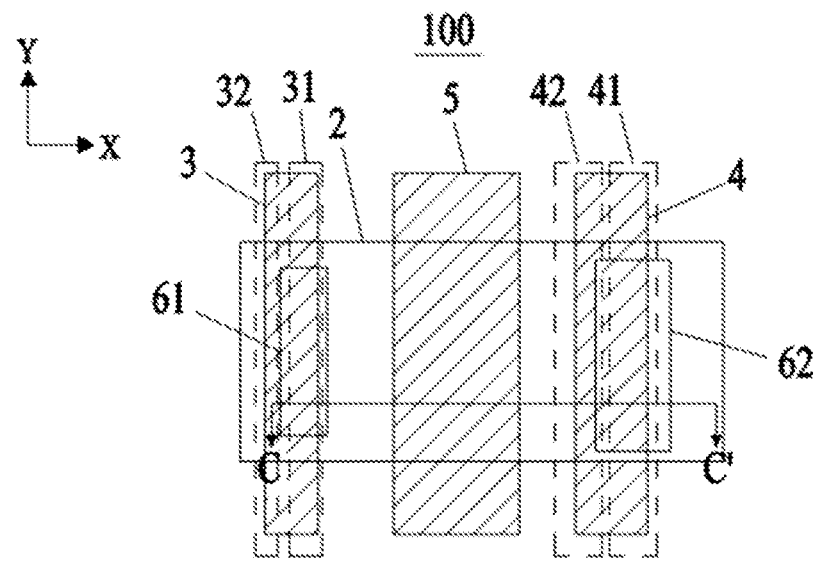
FIG. 8a is a third schematic diagram of a structure of a transistor in a display substrate according to an embodiment of the present disclosure.
Figure 8B:
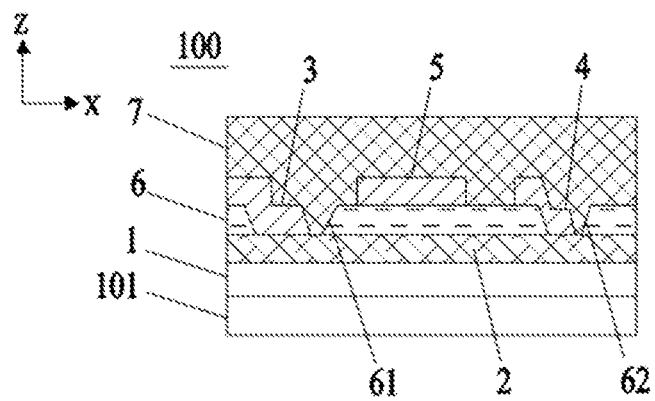
FIG. 8b is a third cross-sectional view of a display substrate according to an embodiment of the present disclosure.

FIG. 8a is a third schematic diagram of a structure of a transistor in a display substrate according to an embodiment of the present disclosure. FIG. 8b is a third cross-sectional view of a display substrate according to an embodiment of the present disclosure. Herein, FIG. 8b is a cross-sectional view along C-C' in FIG. 8a. In an exemplary embodiment, as shown in FIGS. 8a and 8b, in a direction perpendicular to the display substrate, the transistor 100 in the display substrate according the an embodiment of the present disclosure includes a buffer layer 1, a semiconductor layer, a first insulating layer 6, a conductive layer, and a second insulating layer 7 disposed on a base substrate 101. The semiconductor layer includes an active layer pattern 2. The conductive layer includes a first source-drain electrode 3, a second source-drain electrode 4 and a first gate electrode 5. Orthographic projections of the first gate electrode 5 and the active layer pattern 2 on the base substrate 101 are overlapped with each other, and the first gate electrode 5 and the active layer pattern 2 are separated from each other by the first insulating layer 6 and are not in contact with each other. A first via 61 and a second via 62 are provided in the first insulating layer 6, the first source-drain electrode 3 includes a fourth sub-electrode 31 and a fifth sub-electrode 32 connected with each other. The fifth sub-electrode 32 is located on a side of the fourth sub-electrode 31 away from the first gate electrode 5, the fourth sub-electrode 31 is electrically connected with the active layer pattern 2. Orthographic projections of the fifth sub-electrode 32 and the active layer pattern 2 on the base substrate 101 are overlapped with each other and the fifth sub-electrode 32 and the active layer pattern 2 are separated from each other by the first insulating layer 6 and not in contact with each other. The second source-drain electrode 4 includes a first sub-electrode 41 and a second sub-electrode 42 connected with each other. The first sub-electrode 41 is electrically connected with the active layer pattern 2 through the second via 62. The second sub-electrode 42 is located on a side of the first sub-electrode 41 close to the first gate electrode 5. Orthographic projections of the second sub-electrode 4 and the active layer pattern 2 on the base substrate 101 are overlapped with each other, and the second sub-electrode 42 and the active layer pattern 2 are separated from each other by the first insulating layer 6 and are not in contact with each other.

Figure 9A:
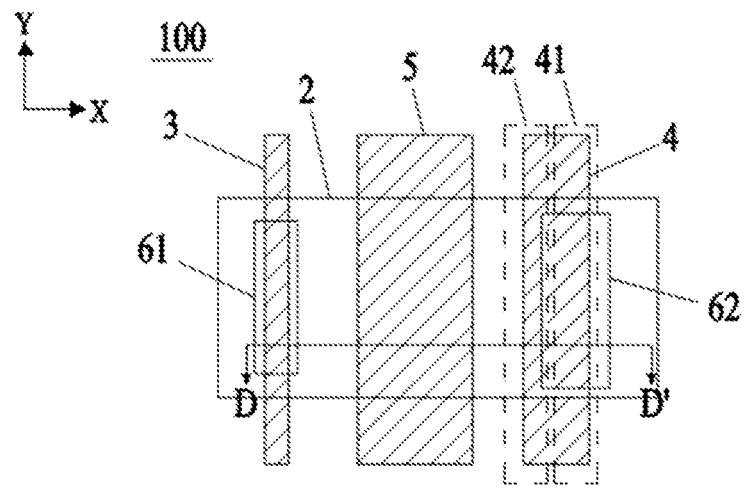
FIG. 9a is a fourth schematic diagram of a structure of a transistor in a display substrate according to an embodiment of the present disclosure.
Figure 9B:
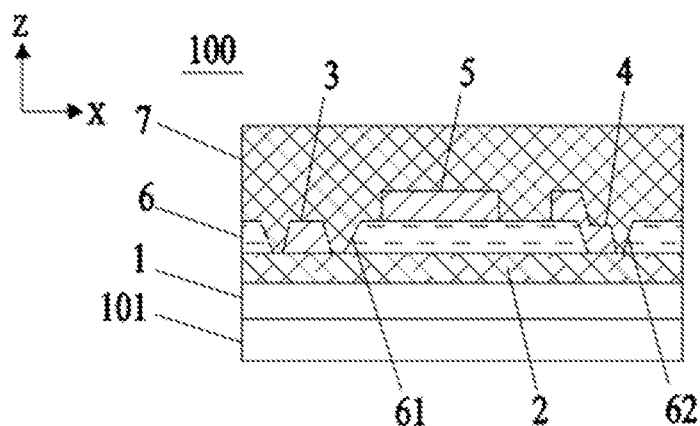
FIG. 9b is a fourth cross-sectional view of a display substrate according to an embodiment of the present disclosure.

FIG. 9a is a fourth schematic diagram of a structure of a transistor in a display substrate according to an embodiment of the present disclosure. FIG. 9b is a fourth cross-sectional view of a display substrate according to an embodiment of the present disclosure. Herein, FIG. 9b is a cross-sectional view along D-D' in FIG. 9a. In an exemplary embodiment, as shown in FIGS. 9a and 9b, in a direction perpendicular to the display substrate, the transistor 100 in the display substrate according to the embodiment of the present disclosure includes a buffer layer 1, a semiconductor layer, a first insulating layer 6, a conductive layer, and a second insulating layer 7 disposed on a base substrate 101. The semiconductor layer includes an active layer pattern 2. The conductive layer includes a first source-drain electrode 3, a second source-drain electrode 4 and a first gate electrode 5. Orthographic projections of the first gate electrode 5 and the active layer pattern 2 on the base substrate 101 are overlapped with each other, and the first gate electrode 5 and the active layer pattern 2 are separated from each other by the first insulating layer 6 and are not in contact with each other. A first via 61 and a second via 62 are provided in the first insulating layer 6, and the first source-drain electrode 3 is electrically connected with the active layer pattern 2 through the first via 61. The second source-drain electrode 4 includes a first sub-electrode 41 and a second sub-electrode 42 connected with each other, the first sub-electrode 41 is electrically connected with the active layer pattern 2 through the second via 62, the second sub-electrode 42 is located on a side of the first sub-electrode 41 close to the first gate electrode 5. Orthographic projections of the second sub-electrode 42 and the active layer pattern 2 on the base substrate 101 are overlapped with each other, and the second sub-electrode 42 and the active layer pattern 2 are separated from each other by the first insulating layer 6 and are not in contact with each other.

In exemplary embodiments, the display substrate according to the embodiment of the present disclosure may be an LCD display substrate, a flexible OLED display substrate, a QLED display substrate, a Micro-LED display substrate, or a Mini-LED display substrate.

Figure 10:
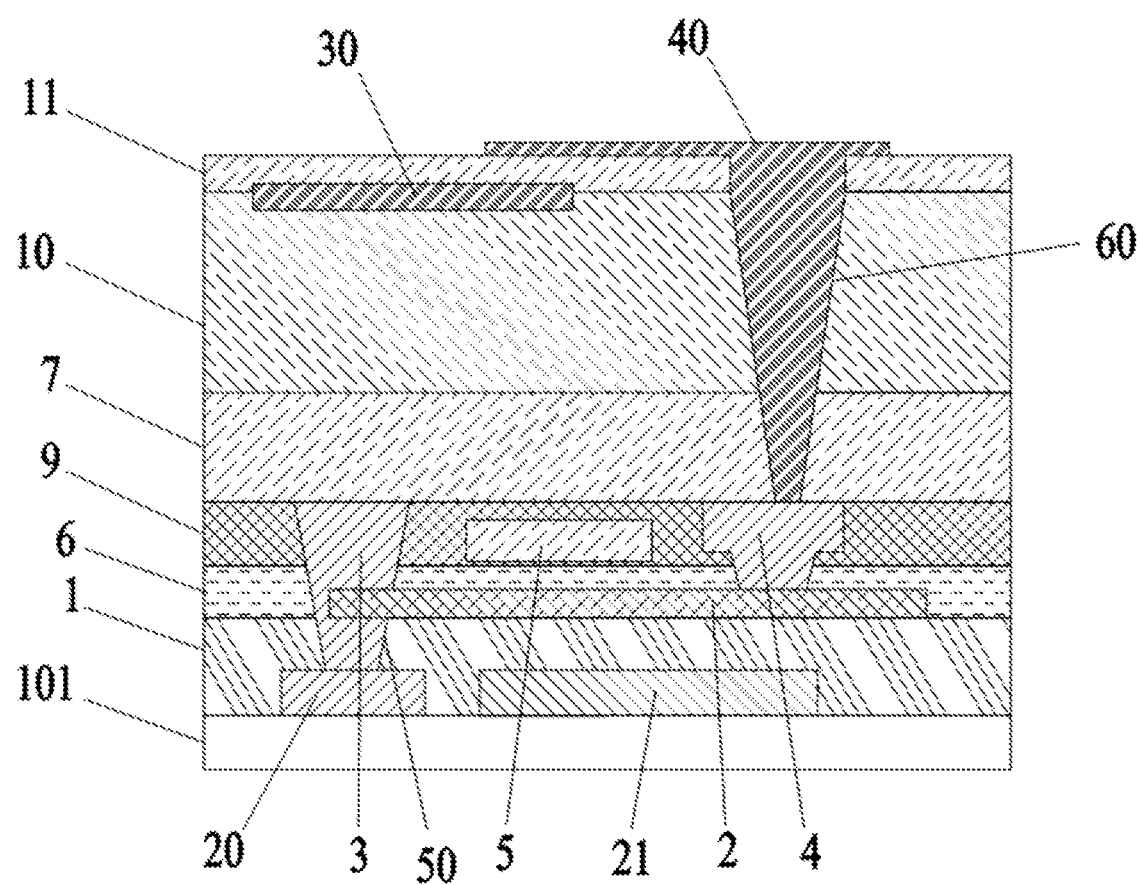
FIG. 10 is a cross-sectional view of a display substrate according to an embodiment of the present disclosure.

FIG. 10 is a cross-sectional view of a display substrate according to an embodiment of the present disclosure. Taking a case that the display substrate according to the embodiment of the present disclosure is an LCD display substrate as an example, in an exemplary embodiment, as shown in FIG. 10, the display substrate according to the embodiment of the present disclosure includes a base substrate 101 and a first conductive layer, a buffer layer 1, a semiconductor layer, a first insulating layer 6, a second conductive layer, a third insulating layer 9, a third conductive layer, a second insulating layer 7, a planarization layer 10, a fourth conductive layer, a fourth insulating layer 11, and a fifth conductive layer disposed on the base substrate 101 sequentially.

In an exemplary embodiment, as shown in FIG. 10, the base substrate 101 may be made of a transparent material such as glass or quartz.

In an exemplary embodiment, as shown in FIG. 10, the first conductive layer is disposed on the base substrate 101, the first conductive layer includes a signal line 20 and a light-shielding layer 21. The signal line 20 may be a data signal line and electrically connected with the first source-drain electrode 3, and the signal line 20 is configured to provide a drive signal to the first source-drain electrode 3. Orthographic projections of the light-shielding layer 21 and the active layer pattern 2 on the base substrate 101 are overlapped with each other, and the light-shielding layer 21 is configured to shield light rays. Materials of both the signal line 20 and the light shielding layer 21 may be in a laminated structure of molybdenum (Mo), aluminum (Al) and aluminum (Al), or a laminated structure of molybdenum-niobium alloy (MoNb) and copper (Cu), or a laminated structure of molybdenum-niobium alloy (MTD) and copper (Cu), or a laminated structure of molybdenum-niobium alloy (MoNb), copper (Cu) and molybdenum-niobium alloy (MTD), and thicknesses of the signal line 20 and the light shielding layer 21 may be from 1000 to 10000 A.

In an exemplary embodiment, as shown in FIG. 10, the buffer layer 1 is provided on a side of the first conductive layer away from the base substrate 101 and covers the signal line 20 and the light shielding layer 21, and a third via 50 is provided in the buffer layer 1. The first source-drain electrode 3 is electrically connected with the signal line 20 through the third via 50. A material of the buffer layer 1 may be a silicon oxide compound (SiOx) or in a laminated structure of silicon nitrogen compound (SiNx) and silicon oxide compound (SiOx), and a thickness of the buffer layer 1 may be 100 nm to 700 nm.

In an exemplary embodiment, as shown in FIG. 10, the semiconductor layer is disposed on a side of the buffer layer 1 away from the base substrate 101 and includes an active layer pattern 2. The active layer pattern 2 may have a thickness of 10 nm to 80 nm.

In an exemplary embodiment, as shown in FIG. 10, the first insulating layer 6 is provided on a side of the semiconductor layer away from the base substrate 101 and covers the active layer pattern 2. A first via 61 and a second via 62 are provided in the first insulating layer 6, a material of the first insulating layer 6 may be a silicon oxide compound (SiOx), and a thickness of the first insulating layer 6 may be 600 A to 2000 A. Herein, the first via 61 may be formed by a same manufacturing process as the third via 50 in the buffer layer 1.

In an exemplary embodiment, as shown in FIG. 10, the second conductive layer is disposed on a side of the first insulating layer 6 away from the base substrate 101. The second conductive layer includes a first gate electrode 5, orthographic projections of the first gate electrode 5 and the active layer pattern 2 on the base substrate 101 are overlapped with each other, and the first gate electrode 5 and the active layer pattern 2 are separated from each other by the first insulating layer 6 and are not in contact with each other. A material of the first gate electrode 5 may be in a laminated structure of molybdenum-niobium alloy (MoNb) and copper (Cu), or a laminated structure of molybdenum-niobium alloy (MTD) and copper (Cu), or a laminated structure of molybdenum-niobium alloy (MoNb), copper (Cu) and molybdenum-niobium alloy (MTD). A thickness of the first gate electrode 5 may be 200 nm to 1200 nm.

In an exemplary embodiment, as shown in FIG. 10, the third insulating layer 9 is provided on a side of the second conductive layer away from the base substrate 101 and covers the first gate electrode 5, a material of the third insulating layer 9 may be a silicon oxide compound (SiOx), or in a laminated structure of a silicon nitride compound (SiNx) and a silicon oxide compound (SiOx), and a thickness of the third insulating layer 9 may be 200 nm to 400 nm.

In an exemplary embodiment, as shown in FIG. 10, the third conductive layer is disposed on a side of the third insulating layer 9 away from the base substrate 101. The third conductive layer includes a first source-drain electrode 3 and a second source-drain electrode 4. The first source-drain electrode 3 is electrically connected with the active layer pattern 2 through the first via 61, the second source-drain electrode 4 includes a first sub-electrode 41, a second sub-electrode 42 and a third sub-electrode 43 connected with each other, the second sub-electrode 42 is located on a side of the first sub-electrode 41 close to the first gate electrode 5, and the third sub-electrode is 43 located on a side of the first sub-electrode 41 away from the first gate electrode 5. Orthographic projections of both the second sub-electrode 42 and the third sub-electrode 43 on the base substrate 101 are overlapped with the orthographic projection of the active layer pattern 2 on the base substrate 101, and the second sub-electrodes 42 and the third sub-electrodes 43 are both separated from the active layer pattern 2 by the first insulating layer 6 and the third insulating layer 9, and are not in contact with each other. The first sub-electrode 41 is electrically connected with the active layer pattern 2 through the second via 62. Materials of the first source-drain electrode 3 and the second source-drain electrode 4 may be in a laminated structure of molybdenum (Mo), aluminum (Al) and aluminum (Al), or a laminated structure of molybdenum-niobium alloy (MoNb) and copper (Cu), or a laminated structure of molybdenum-niobium alloy (MTD) and copper (Cu), or a laminated structure of molybdenum-niobium alloy (MoNb), copper (Cu) and molybdenum-niobium alloy (MTD). Thicknesses of the first source-drain electrode 3 and the second source-drain electrode 4 may be from 1000 to 10000 A. Herein, the first source-drain electrode 3, the second source-drain electrode 4, the first gate electrode 5 and the active layer pattern 2 constitute a transistor.

In an exemplary embodiment, as shown in FIG. 10, the second insulating layer 7 is provided on a side of the third conductive layer away from the base substrate 101 and covers the first source-drain electrode 3 and the second source-drain electrode 4. A material of the second insulating layer 7 may be a silicon oxide compound (SiOx) or in a laminated structure of a silicon nitride compound (SiNx) and a silicon oxide compound (SiOx), and a thickness of the second insulating layer 7 may be 200 nm to 400 nm.

In the exemplary embodiment, as shown in FIG. 10, the planarization layer 10 is provided on a side of the second insulating layer 7 away from the base substrate 101, a material of the planarization layer 10 may be an organic material, and a thickness of the planarization layer 10 may be 2 um to 3 um.

In an exemplary embodiment, as shown in FIG. 10, the fourth conductive layer is disposed on a side of the planarization layer 10 away from the base substrate 101, and the fourth conductive layer includes a common electrode 30. A material of the common electrode 30 may be indium gallium zinc oxide (IGZO) or indium zinc oxide (IZO), and a thickness of the common electrode 30 may be 400 A to 1000 A.

In an exemplary embodiment, as shown in FIG. 10, the fourth insulating layer 11 is provided on a side of the fourth conductive layer away from the base substrate 101 and covers the common electrode 30. A material of the fourth insulating layer 11 may be a silicon oxide compound (SiOx), or in a laminated structure of a silicon nitrogen compound (SiNx) and a silicon oxide compound (SiOx), and a thickness of the fourth insulating layer 11 may be 1000 A to 3000 A.

In an exemplary embodiment, as shown in FIG. 10, the fifth conductive layer is disposed on a side of the fourth insulating layer 11 away from the base substrate 101, the fifth conductive layer includes a pixel electrode 40, a fourth via 60 is provided in each of the second insulating layer 7, the planarization layer 10 and the fourth insulating layer 11. The pixel electrode 40 is electrically connected with the second source-drain electrode 4 through the fourth via 60. A material of the pixel electrode 40 may be indium tin oxide (ITO) or indium zinc oxide (IZO), and a thickness of the pixel electrode 40 may be 40 nm to 135 nm.

In some embodiments, a first insulating layer in a display substrate according to an embodiment of the present disclosure includes at least one insulating layer pattern. The at least one insulating layer pattern covers a part of an active layer pattern, the insulating layer pattern does not cover a part of the active layer pattern, that is, there is a non-overlapping region between orthographic projections of the insulating layer pattern and at least part of the active layer pattern on the base substrate, so that at least part of the active layer pattern is exposed, the first source-drain electrode, the first gate electrode and the second source-drain electrode are all located on a side of the first insulating layer away from the base substrate, and the first sub-electrodes of the first source-drain electrode and the second source-drain electrode are electrically connected with the non-overlapping region of the active layer pattern respectively. For example, there is a non-overlapping region between an orthographic projection of edge regions on two sides of the active layer pattern and the orthographic projection of the active layer pattern on the base substrate, so that the edge regions on the two sides of the active layer pattern are exposed, and the first sub-electrodes of the first source-drain electrode and the second source-drain electrode are electrically connected with the edge regions on the two sides of the active layer pattern respectively. A manufacturing progress of a display substrate according to the present disclosure is made to reduce the manufacturing processes of forming the first via and the second via in the first insulating layer, simplifies the manufacturing processes and reduces the production cost.

In some embodiments, the first gate electrode in the display substrate according to the embodiment of the present disclosure may be manufactured using a same material as the first source-drain electrode by a same manufacturing process. The second source-drain electrode may be integrally formed with the pixel electrode, and the second source-drain electrode and the pixel electrode may be manufactured using a same material by a same manufacturing process. Accordingly, the manufacturing process of the display substrate according to the present disclosure is simplified and the production cost is reduced.

In some embodiments, a first source-drain electrode in a display substrate according to an embodiment of the present disclosure may be integrally formed with the active layer pattern to form a layer of film structure, and the first source-drain electrode and the active layer pattern may be manufactured by a same manufacturing process using a same material. The second source-drain electrode may be integrally formed with the pixel electrode, and the second source-drain electrode and the pixel electrode may be manufactured by a same manufacturing process using a same material. Accordingly, the manufacturing process of the display substrate according to the present disclosure is simplified and the production cost is reduced.

In some embodiments, a first insulating layer in a display substrate according to an embodiment of the present disclosure includes at least one insulating layer pattern. The at least one insulating layer pattern covers a part of the active layer pattern. The at least one insulating layer pattern does not cover a part of the active layer pattern, that is, there is a non-overlapping region between orthographic projections of the insulating layer pattern and at least part of the active layer pattern on the base substrate, so that at least part of the active layer pattern is exposed. The first source-drain electrode, the first gate electrode and the second source-drain electrode are all located on a side of the first insulating layer away from the base substrate, and the first sub-electrodes of the first source-drain electrode and the second source-drain electrode are electrically connected with the non-overlapping region of the active layer pattern respectively. The first gate electrode and the first source-drain electrode may be manufactured by a same manufacturing process using a same material. The second source-drain electrode may be integrally formed with the pixel electrode, and the second source-drain electrode and the pixel electrode may be manufactured by a same manufacturing process using a same material. Accordingly, the manufacturing process of the display substrate according to the present disclosure is simplified and the production cost is reduced.

In some embodiments, a first insulating layer in a display substrate according to an embodiment of the present disclosure includes at least one insulating layer pattern, the at least one insulating layer pattern covers a part of the active layer pattern. The at least one insulating layer pattern does not cover a part of the active layer pattern, that is, there is a non-overlapping region between orthographic projections of the insulating layer pattern and at least part of the active layer pattern on the base substrate, so that at least part of the active layer pattern is exposed. The first source-drain electrode, the first gate electrode and the second source-drain electrode are all located on a side of the first insulating layer away from the base substrate. The first source-drain electrode may be integrally formed with the active layer pattern to form a layer of film structure, and the first source-drain electrode and the active layer pattern may be manufactured by a same manufacturing process using a same material. The second source-drain electrode may be integrally formed with the pixel electrode, and the second source-drain electrode and the pixel electrode may be manufactured by a same manufacturing process using a same material. Accordingly, the manufacturing process of the display substrate according to the present disclosure is simplified and the production cost is reduced.

In some embodiments, the buffer layer may be eliminated in a display substrate according to an embodiment of the present disclosure, a first source-drain electrode and an active layer pattern in a display substrate according to an embodiment of the present disclosure may be integrally formed to form a layer of film structure, and the first source-drain electrode and the active layer pattern may be manufactured by a same manufacturing process using a same material. The signal line is located on a side of the first source-drain electrode close to the base substrate, and the signal line may be electrically contacted with the first source-drain electrode. The second source-drain electrode and the pixel electrode may be manufactured by a same manufacturing process using a same material. A manufacturing progress of the display substrate according to the embodiment of the present disclosure is as follows: first, a signal line is formed on the base substrate, then a semiconductor thin film is formed on the signal line, the semiconductor thin film is formed into a first source-drain electrode and an active layer pattern which are integrally formed, the first source-drain electrode is located on a side of the signal line away from the base substrate, the first source-drain electrode is electrically contacted with the signal line, finally, a first insulating layer is formed on a side of the first source-drain electrode and the active layer pattern away from the base substrate, a first gate electrode and a second source-drain electrode and a pixel electrode which are integrally formed are formed on a side of the first insulating layer away from the base substrate, and the second source-drain electrode is electrically connected with the active layer pattern. The manufacturing process of the display substrate according to the present disclosure is simplified and the production cost is reduced.

In some embodiments, a buffer layer may be eliminated in a display substrate according to an embodiment of the present disclosure, a first source-drain electrode and an active layer pattern in a display substrate according to an embodiment of the present disclosure may be integrally formed to form a layer of film structure, and the first source-drain electrode and the active layer pattern may be manufactured by a same manufacturing process using a same material. The signal line is located on a side of the first source-drain electrode away from the base substrate, and the signal line may be electrically contacted with the first source-drain electrode. The second source-drain electrode and the pixel electrode may be manufactured by a same manufacturing process using a same material. A manufacturing progress of a display substrate according to an embodiment of the present disclosure is as follows: first, a semiconductor thin film is formed on a base substrate, the semiconductor thin film is formed into a first source-drain electrode and an active layer pattern which are integrally formed, a signal line is then formed on a side of the first source-drain electrode away from the base substrate and the signal line is in electrical contact with the first source-drain electrode, finally, a first insulating layer is formed on a side of the signal line away from the base substrate, and a first gate electrode and a second source-drain electrode and a pixel electrode which are integrally formed are formed on a side of the first insulating layer away from the base substrate, and the second source-drain electrode is electrically connected with the active layer pattern. The manufacturing process of the display substrate according to the present disclosure is simplified and the production cost is reduced.

In a display substrate according to an embodiment of the present disclosure, the signal line is in electrical contact with the first source-drain electrode, so that capacitance between the signal line and the first source-drain electrode is reduced, stability the operation of the transistor is ensured, and the power consumption is reduced.

The present disclosure further provides a method for manufacturing a display substrate, which includes:
  forming an active layer pattern on a base substrate;
  forming a first source-drain electrode on the base substrate so that at least a part of the first source-drain electrode is electrically connected with the active layer pattern;
  forming a first gate electrode on a side of the active layer pattern away from the base substrate, so that orthographic projections of the first gate electrode and the active layer pattern on the base substrate are overlapped with each other and the first gate electrode and the active layer pattern are not in contact with each other; and
  forming a second source-drain electrode on a side of the active layer pattern away from the base substrate, the second source-drain electrode includes a first sub-electrode and a second sub-electrode connected with each other, the second sub-electrode is located on a side of the first sub-electrode close to the first gate electrode, the first sub-electrode is electrically connected with the active layer pattern, and orthographic projections of the second sub-electrode and the active layer pattern on the base substrate are overlapped with each other and the second sub-electrode and the active layer pattern are not in contact with each other.

The present disclosure further provides a display device including a display substrate according to the aforementioned embodiment. The display device may be any product or component with a display function, such as a mobile phone, a tablet computer, a television, a display, a laptop computer, a digital photo frame, or a navigator.

Although the implementation modes disclosed in the present disclosure are described as above, the described contents are only implementation modes which are used for facilitating the understanding of the present disclosure, but are not intended to limit the present disclosure. Any skilled person in the art to which the present disclosure pertains may make any modifications and variations to forms and details of implementation without departing from the spirit and scope of the present disclosure. However, the patent protection scope of the present disclosure should be subject to the scope defined by the appended claims.

The invention claimed is:

1. A display substrate comprising: a base substrate and at least one transistor disposed on the base substrate; the at least one transistor comprises:
  an active layer pattern disposed on the base substrate;
  a first source-drain electrode disposed on the base substrate, with the first source-drain electrode being electrically connected with the active layer pattern;
  a first gate electrode disposed on a side of the active layer pattern away from the base substrate, wherein orthographic projections of the first gate electrode and the active layer pattern on the base substrate are overlapped with each other and the first gate electrode and the active layer pattern are not in contact with each other;
  a second source-drain electrode disposed on the side of the active layer pattern away from the base substrate, the second source-drain electrode comprises a first sub-electrode and a second sub-electrode connected with each other, the second sub-electrode is located on a side of the first sub-electrode close to the first gate electrode, the first sub-electrode is electrically connected with the active layer pattern, orthographic projections of the second sub-electrode and the active layer pattern on the base substrate are overlapped with each other and the second sub-electrode and the active layer pattern are not in contact with each other,
  wherein the display substrate further comprises: a signal line electrically connected with the first source-drain electrode, and
  the signal line is located between the first source-drain electrode and the base substrate, and the display substrate further comprises a buffer layer, the buffer layer is located between the signal line and the active layer pattern, a third via is provided in the buffer layer, and the first source-drain electrode is electrically connected with the signal line through the third via.

2. The display substrate according to claim 1, wherein the second source-drain electrode further comprises a third sub-electrode located on a side of the first sub-electrode away from the first gate electrode, and orthographic projections of the third sub-electrode and the active layer pattern on the base substrate are overlapped with each other and the third sub-electrode and the active layer pattern are not in contact with each other.

3. The display substrate according to claim 2, wherein the transistor further comprises a first insulating layer, the first insulating layer is positioned between the active layer pattern and the first gate electrode, the first insulating layer covers the active layer pattern, the first source-drain electrode, the first gate electrode and the second source-drain electrode are all located on a side of the first insulating layer away from the base substrate, a first via and a second via are provided in the first insulating layer, the first source-drain electrode is electrically connected with the active layer pattern through the first via, and the second source-drain electrode is electrically connected with the active layer pattern through the second via.

4. The display substrate according to claim 2, wherein the transistor further comprises a first insulating layer, the first insulating layer comprises at least one insulating layer pattern, the at least one insulating layer pattern covers a part of the active layer pattern, and there is a non-overlapping region between an orthographic projection of the at least one insulating layer pattern and an orthographic projection of at least part of the active layer pattern on the base substrate, the first source-drain electrode, the first gate electrode and the second source-drain electrode are all located on a side of the first insulating layer away from the base substrate, and the first source-drain electrode and the second source-drain electrode are electrically connected with the non-overlapping region of the active layer pattern respectively.

5. The display substrate according to claim 1, wherein the first sub-electrode and the second sub-electrode are integrally formed.

6. The display substrate according to claim 5, wherein the transistor further comprises a first insulating layer, the first insulating layer is positioned between the active layer pattern and the first gate electrode, the first insulating layer covers the active layer pattern, the first source-drain electrode, the first gate electrode and the second source-drain electrode are all located on a side of the first insulating layer away from the base substrate, a first via and a second via are provided in the first insulating layer, the first source-drain electrode is electrically connected with the active layer pattern through the first via, and the second source-drain electrode is electrically connected with the active layer pattern through the second via.

7. The display substrate according to claim 5, wherein the transistor further comprises a first insulating layer, the first insulating layer comprises at least one insulating layer pattern, the at least one insulating layer pattern covers a part of the active layer pattern, and there is a non-overlapping region between an orthographic projection of the at least one insulating layer pattern and an orthographic projection of at least part of the active layer pattern on the base substrate, the first source-drain electrode, the first gate electrode and the second source-drain electrode are all located on a side of the first insulating layer away from the base substrate, and the first source-drain electrode and the second source-drain electrode are electrically connected with the non-overlapping region of the active layer pattern respectively.

8. The display substrate according to claim 1, wherein the first source-drain electrode comprises a fourth sub-electrode and a fifth sub-electrode connected with each other, the fifth sub-electrode is located on a side of the fourth sub-electrode away from the first gate electrode, the fourth sub-electrode is electrically connected with the active layer pattern, and orthographic projections of the fifth sub-electrode and the active layer pattern on the base substrate are overlapped with each other and the fifth sub-electrode and the active layer pattern are not in contact with each other.

9. The display substrate according to claim 8, wherein the transistor further comprises a first insulating layer, the first insulating layer is positioned between the active layer pattern and the first gate electrode, the first insulating layer covers the active layer pattern, the first source-drain electrode, the first gate electrode and the second source-drain electrode are all located on a side of the first insulating layer away from the base substrate, a first via and a second via are provided in the first insulating layer, the first source-drain electrode is electrically connected with the active layer pattern through the first via, and the second source-drain electrode is electrically connected with the active layer pattern through the second via.

10. The display substrate according to claim 1, wherein the transistor further comprises a first insulating layer, the first insulating layer is positioned between the active layer pattern and the first gate electrode, the first insulating layer covers the active layer pattern, the first source-drain electrode, the first gate electrode and the second source-drain electrode are all located on a side of the first insulating layer away from the base substrate, a first via and a second via are provided in the first insulating layer, the first source-drain electrode is electrically connected with the active layer pattern through the first via, and the second source-drain electrode is electrically connected with the active layer pattern through the second via.

11. The display substrate according to claim 1, wherein the transistor further comprises a first insulating layer, the first insulating layer comprises at least one insulating layer pattern, the at least one insulating layer pattern covers a part of the active layer pattern, and there is a non-overlapping region between an orthographic projection of the at least one insulating layer pattern and an orthographic projection of at least part of the active layer pattern on the base substrate, the first source-drain electrode, the first gate electrode and the second source-drain electrode are all located on a side of the first insulating layer away from the base substrate, and the first source-drain electrode and the second source-drain electrode are electrically connected with the non-overlapping region of the active layer pattern respectively.

12. The display substrate according to claim 1, further comprising a pixel electrode disposed on a side of the transistor away from the base substrate, the pixel electrode and the second source-drain electrode are integrally formed.

13. The display substrate according to claim 1, wherein the first source-drain electrode and the active layer pattern are integrally formed.

14. The display substrate according to claim 1, wherein the first source-drain electrode and the active layer pattern are integrally formed and the signal line is located on a side of the first source-drain electrode close to the base substrate, or the signal line is located on a side of the first source-drain electrode away from the base substrate.

15. The display substrate according to claim 1, wherein the material of the active layer pattern is made of an oxide semiconductor.

16. The display substrate according to claim 1, wherein the transistor is configured as a transistor in a gate driving circuit.

17. A display device comprising the display substrate according to claim 1.

18. A method for manufacturing a display substrate, comprising:
    forming an active layer pattern on a base substrate;
    forming a first source-drain electrode on the base substrate so that at least a part of the first source-drain electrode is electrically connected with the active layer pattern;
    forming a first gate electrode on a side of the active layer pattern away from the base substrate, so that orthographic projections of the first gate electrode and the active layer pattern on the base substrate are overlapped with each other and the first gate electrode and the active layer pattern are not in contact with each other;

forming a second source-drain electrode on the side of the active layer pattern away from the base substrate, the second source-drain electrode comprises a first sub-electrode and a second sub-electrode connected with each other, the second sub-electrode is located on a side of the first sub-electrode close to the first gate electrode, the first sub-electrode is electrically connected with the active layer pattern, and orthographic projections of the second sub-electrode and the active layer pattern on the base substrate are overlapped with each other and the second sub-electrode and the active layer pattern are not in contact with each other, wherein the method further comprises: electrically connecting a signal line with the first source-drain electrode, and the signal line is located between the first source-drain electrode and the base substrate, and the display substrate further comprises a buffer layer, the buffer layer is located between the signal line and the active layer pattern, a third via is provided in the buffer layer, and the first source-drain electrode is electrically connected with the signal line through the third via.

* * * * *